(12) United States Patent
Senoo

(10) Patent No.: US 8,169,087 B2
(45) Date of Patent: May 1, 2012

(54) SEMICONDUCTOR DEVICE

(75) Inventor: Masaru Senoo, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 167 days.

(21) Appl. No.: 12/811,770

(22) PCT Filed: Jan. 7, 2009

(86) PCT No.: PCT/IB2009/000014
§ 371 (c)(1),
(2), (4) Date: Jul. 6, 2010

(87) PCT Pub. No.: WO2009/087561
PCT Pub. Date: Jul. 16, 2009

(65) Prior Publication Data
US 2010/0276817 A1    Nov. 4, 2010

(30) Foreign Application Priority Data
Jan. 9, 2008 (JP) .................................. 2008-002157

(51) Int. Cl.
*H01L 29/40* (2006.01)
(52) U.S. Cl. .................................. 257/784; 257/E23.194
(58) Field of Classification Search .................. 257/758, 257/734, 665, 784, E23.194
See application file for complete search history.

(56) References Cited

U.S. PATENT DOCUMENTS

| | | | |
|---|---|---|---|
| 5,437,405 A | 8/1995 | Asanasavest | |
| 7,741,720 B2 * | 6/2010 | Silverbrook et al. | ......... 257/771 |
| 2004/0026480 A1 | 2/2004 | Imai et al. | |
| 2004/0159924 A1 | 8/2004 | Tokumitsu | |
| 2006/0024942 A1 | 2/2006 | Aiton et al. | |
| 2006/0228825 A1 | 10/2006 | Hembree | |
| 2010/0258943 A1 * | 10/2010 | Senoo | ......... 257/773 |

FOREIGN PATENT DOCUMENTS

| | | |
|---|---|---|
| JP | 60-167434 A | 8/1985 |
| JP | 62-032537 U | 2/1987 |
| JP | 03-034338 A | 2/1991 |
| JP | 05-136199 A | 6/1993 |
| JP | 06-053265 A | 2/1994 |
| JP | 07-131075 A | 5/1995 |
| JP | 2000-208554 A | 7/2000 |
| JP | 2001-298041 A | 10/2001 |
| JP | 2002-222902 A | 8/2002 |
| JP | 2004-228479 A | 8/2004 |

* cited by examiner

*Primary Examiner* — William D Coleman
(74) *Attorney, Agent, or Firm* — Kenyon & Kenyon LLP

(57) ABSTRACT

A protective coating is formed on the surface of a semiconductor device. The surface is located on the side to which an extension portion of a wire connected to a pad of the semiconductor device is pulled. The protective coating is formed such that its height decreases toward the pad.

7 Claims, 14 Drawing Sheets

SEMICONDUCTOR DEVICE

This is a 371 national phase application of PCT/IB2009/000014 filed 7 Jan. 2009, claiming priority to Japanese Patent Application No. 2008-002157filed 9 Jan. 2008, the contents of which are incorporated herein by reference.

BACKGROUND OF THE INVENTION

1. Field of the Invention

The invention relates to a semiconductor device on the surface of which a pad connected to a conductive wire and a protective coating are formed.

2. Description of the Related Art

A wire-bonding process is used to electrically connect a semiconductor device to an external circuit or to other semiconductor device. In a wire-bonding process, a wire that is connected at one end to an external circuit or to other semiconductor device is drawn onto a pad that is formed on the surface of the semiconductor device, and then the conductive wire is connected to the pad, and then the extension portion of the conductive wire is cut off. In the following description, such conductive wires will be simply referred to as "wires".

When connecting each wire to each pad, the semiconductor device may be damaged by the wire. In view of this, some technologies for preventing such damage to the semiconductor device have been developed. Japanese Patent Application Publication No. 2001-298041 (JP-A-2001-298041) describes one such technologies. According to this publication, protective coatings are formed on a semiconductor device. Each protective coating is surrounded the corresponding pad formed on the semiconductor device. According to this structure, due to the difference between the level of the top face of the protective coating surrounding the pad and the level of the top face of the pad, once a pointing capillary, which is used to bond a wire to the pad, contacts the top face of the protective coating surrounding the pad, the pointing capillary is unable to approach the pad any further, and therefore the tip of the pointing capillary does not directly contact the pad. In this manner, the protective coating, which surrounds the pad, prevents damage to the pad. On the other hand, Japanese Patent Application Publication No. 05-136199 (JP-A-05-136199) describes a technology in which a protective coating is formed along an opening of an insulation layer covering the periphery of the pad such that the protective coating covers the surface of the insulation layer (Note that the insulation layer covers the surface of the semiconductor device and therefore it may be regarded as a portion of the semiconductor device and that the pad is exposed within the opening of the insulation layer). If the protective coating is not provided, the wire may contact an edge of the insulation layer that defines the opening when the pointing capillary presses the wire against the pad, and therefore there is a possibility that the wire may be welded to the pad by applying ultrasonic waves to the wire despite that the wire is in contact with the edge of the insulation layer. If ultrasonic waves are applied to the wire while it is in contact with the edge of the insulation layer, the insulation layer may be damaged. According to the technology described in JP-A-05-136199, therefore, in order to prevent the insulation layer covering the periphery of the pad from being damaged by such ultrasonic vibrations, the protective coating is formed along the opening of the insulation layer that determines the area in which the pad is exposed.

In the wire-bonding process, after the wire is connected to the pad, the extension portion of the wire is torn off by being pulled. At this time, the cut end of the extension portion of the wire (i.e., the end of the wire that is held by the pointing capillary to be connected to the next pad in the next wire-bonding process) may scratch and thereby damage the surface of the semiconductor device around the pad. The possibility of the cut end of the wire thus scratching and damaging the surface of the semiconductor device around the pad may be minimized or eliminated by forming a protective coating on the surface of the semiconductor device around the pad. However, such protective coatings in the related art cannot reliably prevent such scratching and damaging of the surface of the semiconductor device by the cut end of the wire.

In order to prevent scratching and damaging of the surface of the semiconductor device by the cut end of the wire, it is necessary to form a protective coating having a sufficient strength, that is, a relatively thick protective coating. If a thick protective coating is formed around the pad, the wire contacts the ridge line formed between the top face and the side faces of the protective coating. FIG. 7 illustrates an example case where a protective coating 70 is formed on a semiconductor device 402 at a position adjacent to the pad 16. The protective coating 70 has a thickness sufficient to prevent damage to the surface of the semiconductor device 402 by the cut end 14f of a wire 14. In this example, an acutely angled ridge line 72 is formed between the top face of the protective coating 70 and one side face of the protective coating 70, and an extension portion 14e of the wire 14 contacts the ridge line 72 in the wire-bonding process. Because the ridge line 72 is a very narrow portion of the protective coating 70, if the extension portion 14e of the wire 14 contacts the protective coating 70 at the ridge line 72, the protective coating 70 may be scraped off by the extension portion 14e of the wire 14. At this time, some pieces of the scraped protective coating 70 may attach the wire 14. If the next bonding process is performed using the wire 14 with said pieces of the protective coating 70 attached thereon, the bonding process may fail to be performed properly. Although such abrasion of the protective coating 70 may be prevented by increasing the hardness of the protective coating 70, if the protective coating 70 is made harder, it increases the possibility of delamination of the protective coating. Thus, the related-art protective coating 70 causes these problems when it protects the surface of the semiconductor device from being scratched and thus damaged by the cut end 14f of the wire 14.

Further, in the related art, in order to protect the surface of the semiconductor device from being scratched and thus damaged by the cut end of the wire, a pad is formed to cover the region where the cut end of the wire can damage the surface of the semiconductor device. However, it is often the case that useful semiconductor structures cannot be provided in the portion of the semiconductor substrate below the pad. According to the related art, further, the pad needs to be made relatively large to protect the surface of the semiconductor device from being damaged by the cut end of the wire, and therefore the area for accommodating semiconductor structures is reduced accordingly.

SUMMARY OF THE INVENTION

The invention provides a semiconductor device with an improved protective coating for protecting the surface of the semiconductor device.

The first aspect of the invention relates to a semiconductor device having: a pad to which a conductive wire is connected; and a protective coating that is formed on a surface of the semiconductor device near the pad and that is shaped such that the height of the protective coating decreases toward the pad.

According to the semiconductor device described above, because the height of the protective coating decreases toward the pad, the extension portion of the conductive wire and the protective coating contact each other via a large contact area when the extension of the conductive wire connected to the pad is pulled and thus cut off. That is, even if the thickness of the protective coating is sufficient to tolerate scraping by the cut end of the conductive wire, because the protective coating is shaped such that its height decreases toward the pad, the area of contact between the conductive wire and the protective coating is large, and this reduces the possibility of damaging of the protective coating. According to the first aspect of the invention, as such, it is possible to minimize the possibility of scraping and delamination of the protective coating formed on the semiconductor device.

According to the semiconductor device of the first aspect of the invention, because the protective coating protects the pad from being damaged by the cut end of the conductive wire, the pad can be made smaller in size. That is, because the pad does not need to be used as a protector against the cut end of the conductive wire, the size of the pad may be reduced to the minimum size necessary to allow the conductive wire to be connected to the pad. As a result, the region for accommodating semiconductor structures may be expanded accordingly. According to the first aspect of the invention, as such, a semiconductor device having characteristics better than those of conventional semiconductor devices may be produced without increasing the size of the semiconductor substrate.

The semiconductor device of the first aspect of the invention may be such that the surface of the protective coating on the side of the pad is formed in a curved shape that descends toward the pad as in the example case illustrated in FIG. 2. Referring to FIG. 2, a protective coating 18 having a curved surface on the side of a pad 16 is formed on a semiconductor device 2. In this case, an extension portion 14e of a wire 14 contacts the protective coating 18 via a large contact as it is pulled during the wire-bonging process, and therefore the possibility of scraping of the protective coating 18 by the extension portion 14e of the wire 14 is low Further, the semiconductor device of the first aspect of the invention may be such that the surface of the protective coating on the side of the pad is formed in a stepped shape that descends toward the pad as in the example case illustrated in FIG. 5. Referring to FIG. 5, a protective coating 218 having a stepped surface on the side of the pad 16 is formed on a semiconductor device 202. In this case, the extension portion 14e of the wire 14 contacts the protective coating 218 via multiple points 274a, 274b, and 274c as it is pulled during the wire-bonging process, and owing to such multi-point contact, the possibility that the extension portion 14e of the wire 14 will scrape the protective coating 218 is reduced. Further, the semiconductor device of the first aspect of the invention may be such that the surface of the protective coating on the side of the pad is downwardly inclined toward the pad as in the example case illustrated in FIG. 6. Referring to FIG. 6, a protective coating 318 having an inclined surface on the side of the pad 16 is formed on a semiconductor device 302. In this case, the extension portion 14e of the wire 14 contacts the protective coating 218 over a large contact area as it is pulled during the wire-bonging process, which thereby reduces the possibility of scraping of the protective coating 318 by the extension portion 14e of the wire 14 is low.

Meanwhile, the region for forming the protective coating may be limited as needed as long as the surface of the semiconductor device may be properly protected from being damaged by the cut end of the conductive wire. For example, the semiconductor device of the first aspect of the invention may be such that the productive coating is provided on a region of the surface of the semiconductor device on a first side toward which the conductive wire is pulled during a wire-bonding process for bonding the conductive wire to the semiconductor device, and a region of the surface of the semiconductor device on a second side that is opposite to the first side is not provided with productive coating. In this case, there is no possibility of contact between the protective coating and the portion of the conductive wire connected to the pad, and therefore the size of the pad may be reduced and the direction in which to arrange the conductive wire may be freely selected.

Further, the semiconductor device of the first aspect of the invention may be such that the level of the surface of the protective coating is lower than a region through which the extension portion of the conductive wire connected to the pad passes when the extension portion is set in the position where the extension portion is cut off. In this case, the protective coating does not affect the process for cutting the conductive wire, and therefore the extension portion of the conductive wire may be pulled and thus cut off without being affected by the protective coating. Further, the semiconductor device of the first aspect of the invention may be such that the level of the surface of the protective coating is higher than the path that the cut end of the conductive wire would take as the extension portion of the conductive wire is cut off in the absence of the protective coating. In this case, the path of the cut end of the conductive wire moves upward due to the presence of the protective coating, and this further reduces the possibility of scraping of the surface of the semiconductor device by the cut end of the conductive wire. Further, the semiconductor device of the first aspect of the invention may be such that the surface of the protective coating is located closer to the pad than the position at which the path that the cut end of the conductive wire would take as the extension portion of the conductive wire is cut off parts from the surface of the semiconductor device in the absence of the protective coating. In this case, too, the path of the cut end of the conductive wire moves upward due to the presence of the protective coating, and this further reduces the possibility of scraping of the surface of the semiconductor device by the cut end of the conductive wire. Further, the semiconductor device of the first aspect of the invention may be such that: the level of the surface of the protective coating is lower than the region through which the extension portion of the conductive wire connected to the pad passes as the extension portion is set in the position where the extension portion is cut off; the level of the surface of the protective coating is higher than the path that the cut end of the conductive wire would take as the extension portion of the conductive wire is cut off in the absence of the protective coating; and the surface of the protective coating is located closer to the pad than the position at which the path parts from the surface of the semiconductor device.

According to the invention, thus, because the protective coating protects the surface of the semiconductor device from being damaged by the cut end of the conductive wire, the size of the pad may be reduced and therefore the effective area for accommodating semiconductor structures for accomplishing the functions of the semiconductor device may be expanded accordingly, enabling improvement of the electric characteristics of the semiconductor device.

BRIEF DESCRIPTION OF THE DRAWINGS

The foregoing and further features and advantages of the invention will become apparent from the following descrip

DETAILED DESCRIPTION OF THE EMBODIMENTS

To begin with, the main feature of the first example embodiment is herein clarified. In particular, the main feature is a protective film that covers a portion of the surface of a pad.

Figure 1:
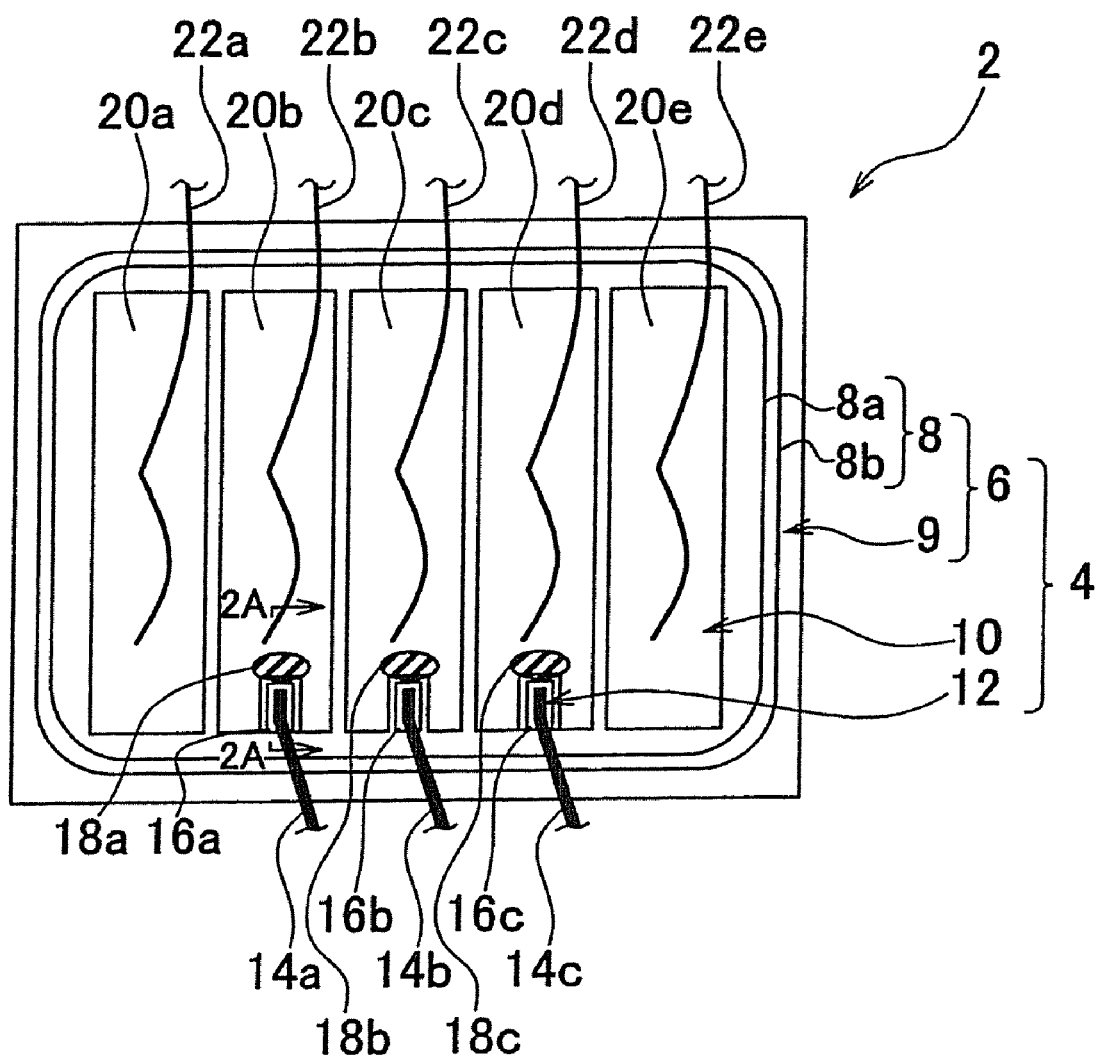
- FIG. 1 is a top view of a semiconductor device 2 according to the first example embodiment of the invention.

FIG. 1 shows a semiconductor device 2 according to the first example embodiment of the invention. In the semiconductor device 2, a terminal pressure-proof portion 6 extends along the entire circumference on the inner side of the outer periphery of a semiconductor substrate 4. A pressure-proof holder portion 8 is formed in the terminal pressure-proof portion 6. The pressure-proof holder portion 8 is constituted of an FLR 8a and an FLR 8b. Effective regions 10 and pad regions 12 are created at locations inward of the pressure-proof holder portion 8. The effective regions 10 are the regions for accommodating various semiconductor structures necessary for accomplishing the required functions of the semiconductor device 2. On the other hand, a non-effective region 9 is created on the outer side of the pressure-proof holder portion 8 of the terminal pressure-proof portion 6. Five emitter pads 20a, 20b, 20c, 20d, and 20e are exposed at the surface of the semiconductor device 2 in the effective region 10. Wires 22a, 22b, 22c, 22d, and 22e are bonded to the emitter pads 20a, 20b, 20c, 20d, and 20e, respectively. It is to be noted that, in the following description, the common elements and components each denoted by a common reference numeral with a different alphabet for distinguishing among them will be collectively denoted by the common reference numeral where their common technical feature, or the like, is described. Each emitter pad 20 is connected to an external circuit (not shown in the drawings) via the wire 22.

Three pads 16a, 16b, and 16c are provided in the respective pad regions 12 on the surface of the semiconductor device 2. Wires 14a, 14b, and 14c are bonded to the pads 16a, 16b, and 16c, respectively. The pads 16 are electrically connected to an external circuit (not shown in the drawings) via the wires 14. It is difficult to produce semiconductor structures necessary for accomplishing the functions of the semiconductor device 2 in the pad regions 12 of the semiconductor substrate 4. The smaller the pad regions 12, the larger the effective regions 10 can be made. In view of this, in the first example embodiment of the invention, each pad 16 is formed in the minimum necessary size for enabling the wires 14 to be bonded to the respective pads 16, and therefore the effective regions 10, which are the regions for accommodating the semiconductor structures for accomplishing the required functions of the semiconductor device 2, are large. Protective coatings 18 are provided adjacent to the respective pads 16. The protective coatings 18 protect the surfaces of the semiconductor device 2 that are adjacent to the respective small pads 16 from being damaged.

Figure 2:
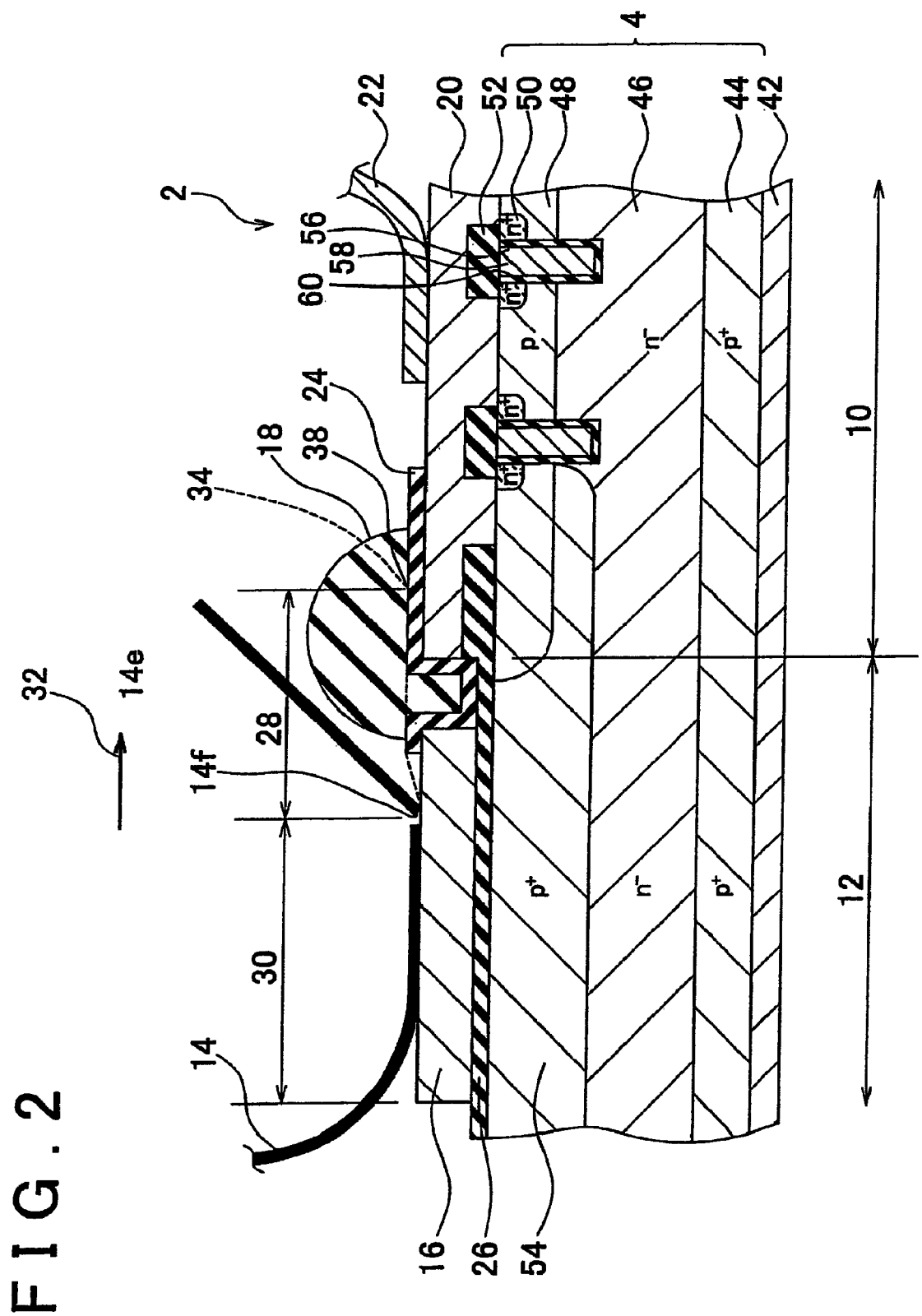
FIG. 2 is a cross-sectional view of the semiconductor device 2.

FIG. 2 shows a cross section taken along line 2A-2A in FIG. 1. The cross-sectional view shows the structure of the semiconductor device 2 and illustrates how the wire 14a is connected to the pad 16a. Note that the following description also applies to the wires 14b, 14c. Referring to FIG. 2, an insulated gate bipolar transistor (to be referred to as "IGBT") is formed in the effective region 10 of the semiconductor device 2. The semiconductor device 2 is constituted of the semiconductor substrate 4 that contains a low concentration of n-type impurities, and the unprocessed portion of the semiconductor substrate 4 forms a drift portion 46. A body portion 48 that contains p-type impurities is provided on the surface of the drift portion 46. Emitter portions 50 that each contains a high concentration of n-type impurities are formed at positions opposed to the surface of the body portion 48. The emitter portions 50 are partitioned from the drift portion 46 by the body portion 48. Trenches 56 are formed at the surfaces of the emitter portions 50. Each trench 56 extends from the surface of the emitter portion 50 down to the drift portion 46 by penetrating the emitter portion 50 and the body portion 48. The bottom and side faces of each trench 56 are coated with a gate insulation coat 60, and a trench gate electrode 58 is disposed in each trench 56. The top face of each trench gate electrode 58 is coated with an interlayer insulation layer 52. The emitter pads 20 are formed on the surface of the semiconductor device 2 in the effective region 10. The emitter pads 20 are electrically connected to the respective emitter portions 50, and the voltages applied to the wires 22 from external circuits (not shown in the drawings) are supplied to the emitter pads 20. The emitter pads 20 are insulated from the respective trench gate electrodes 58 by the interlayer insulation layers 52.

The pads 16 for the gate electrodes are formed on the surface of the semiconductor device 2 in the pad region 12. Each pad 16 is connected to the trench gate electrode 58 although not shown in the drawings, and the voltage applied to each wire 14 from external circuits (not shown in the drawings) is supplied to the trench gate electrode 58 via the pad 16. An interlayer insulation layer 26 having an even thickness is formed between each pad 16 and the semiconductor substrate 4 in the regions other than where said pad 16 and the corresponding trench gate electrode 58 need to be electrically connected to each other. Insulation layers (passivation layers) 24 are formed on the surface of the semiconductor device 2. Each insulation layer 24 is formed on the surface of the portion of the semiconductor device 2 that extends from the end of the pad 16 to the end of the emitter pad 20. Each protective coating 18 is formed on the surface of each insulation layer 24. The protective coating 18 is formed in the region adjacent to the pad 16, and a portion of the protective coating 18 is provided on the surface of the pad 16. A p-type diffusion portion 54 containing a high concentration of p-type impurities is formed on the drift portion 46 in the pad region 12. The p-type diffusion portion 54 is in contact with and thus electrically connected to an end of the body portion 48 containing p-type impurities. A collector portion 44 containing a high concentration of p-type impurities is formed at the bottom of the semiconductor device 2, and a collector electrode 42 is formed on the bottom face of the semiconductor device 2. The collector electrode 42 is electrically connected to the collector portion 44.

According to the semiconductor device 2 of the first example embodiment of the invention, the semiconductor device 2 is fixed on a bonding device (not shown in the drawings), and then each wire 14 is connected to a bonding region 30 of the pad 16. Prior to this process, the other end of the wire 14 (not shown in the drawings) is connected to an external circuit. After the wire 14 has been thus fixed to the pad 16, the wire 14 is cut by being pulled in the direction indicated by the arrow 32 in FIG. 2 using the bonding device.

Figure 12:
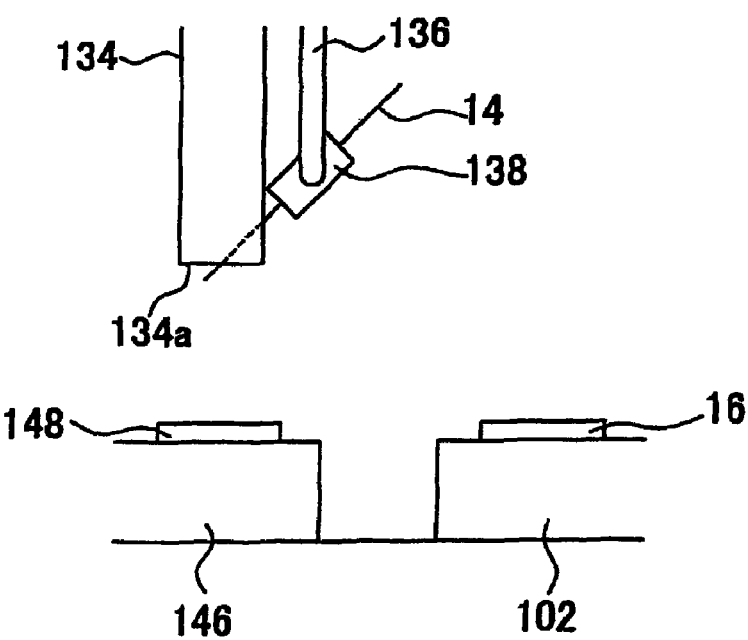
FIG. 12 is a view illustrating a step of a wire-bonding process.
Figure 13:
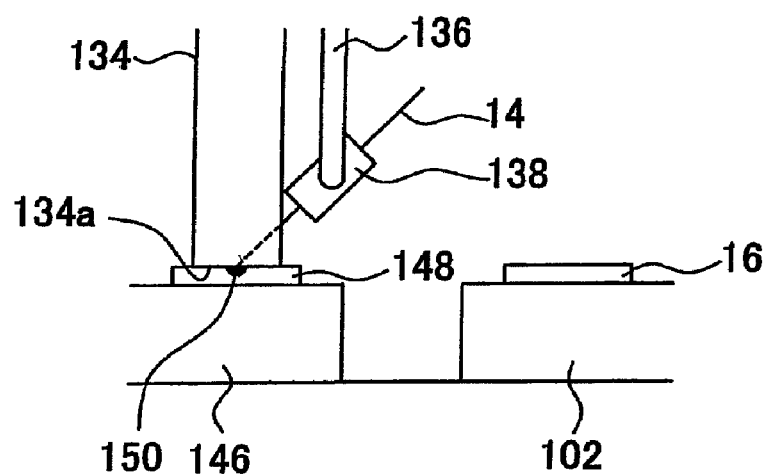
FIG. 13 is a view illustrating another step of the wire-bonding method.
Figure 14:
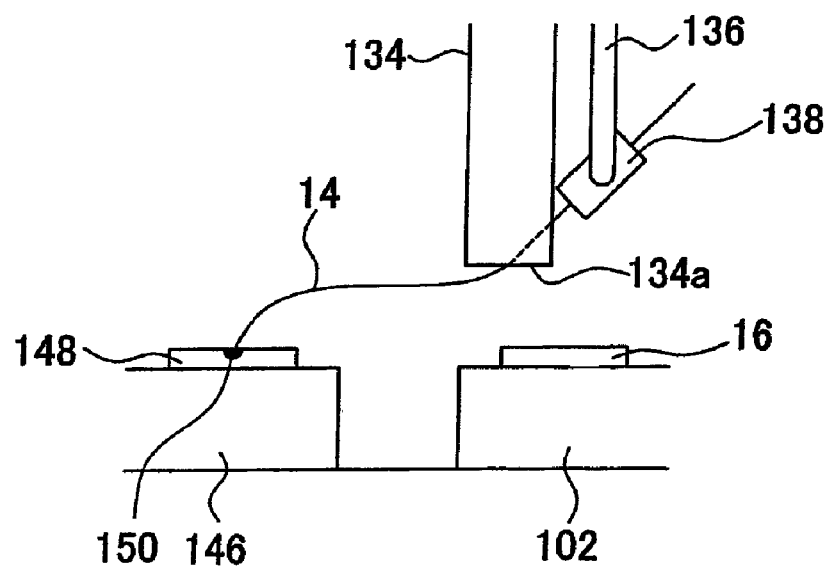
FIG. 14 is a view illustrating another step of the wire-bonding method.

FIG. 12 to FIG. 17 illustrate a method for wire-bonding a semiconductor device 102 to an external circuit 146. Referring to FIG. 12, the wire 14 runs through a clamp 138 and a wedge tool 134, and the front end of the wire 14 protrudes from a bottom face 134*a* of the wedge tool 134. The clamp 138 holds the wire 14. The clamp 138 is connected to the wedge tool 134 via a support 136, and the clamp 138 and the wedge tool 134 are movable relative to each other. In this wire-bonding method, first, referring to FIG. 13, the bottom face 134*a* of the wedge tool 134 is pressed against a pad 148 of the external circuit 146, and then ultrasonic vibration is applied to the wire 14, whereby the wire 14 is bonded to the pad 148. As a result of this bonding process, a bonding trace 150 is created in the surface of the pad 148. Then, referring to FIG. 14, the wire 14, the clamp 138, and the wedge tool 134 are together moved to above the pad 16, which is the next object to which the wire 14 is bonded. At this time, the wire 14 is drawn out from the bottom face 134*a* of the wedge tool 134. Then, referring to FIG. 15, the bottom face 134*a* of the wedge tool 134 is pressed against the pad 16 of the semiconductor device 102, and then ultrasonic vibration is applied to the wire 14, whereby the wire 14 is bonded to the pad 16. As a result of this bonding process, a bonding trace 152 is created in the surface of the pad 16.

Figure 15:
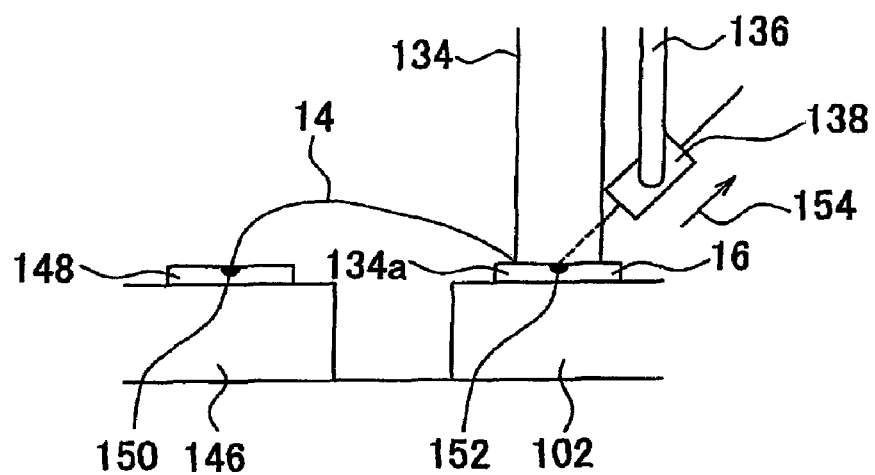
FIG. 15 is a view illustrating another step of the wire-bonding method.
Figure 16:
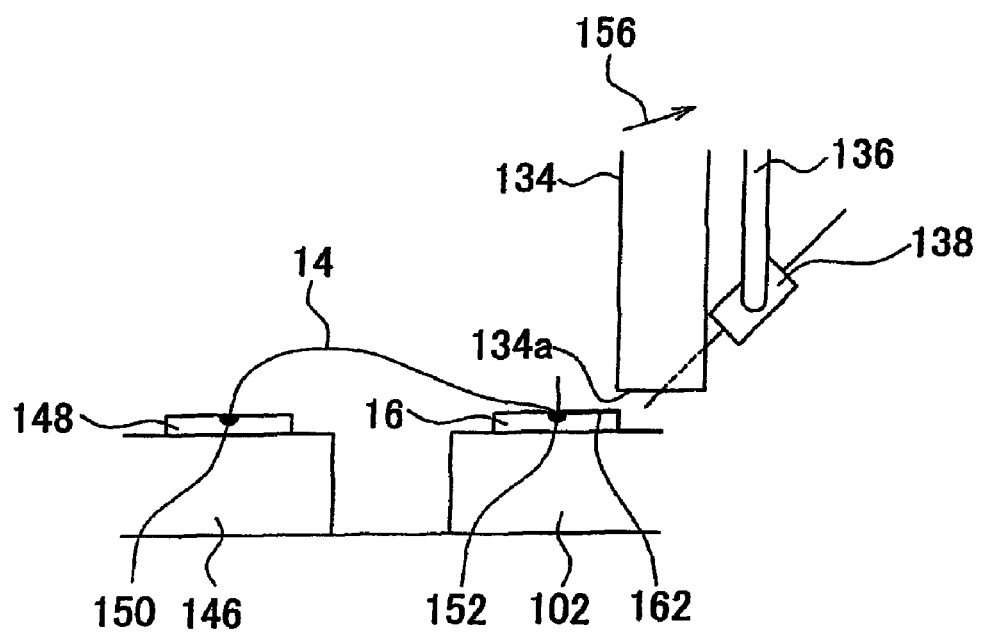
FIG. 16 is a view illustrating another step of the wire-bonding method.
Figure 17:
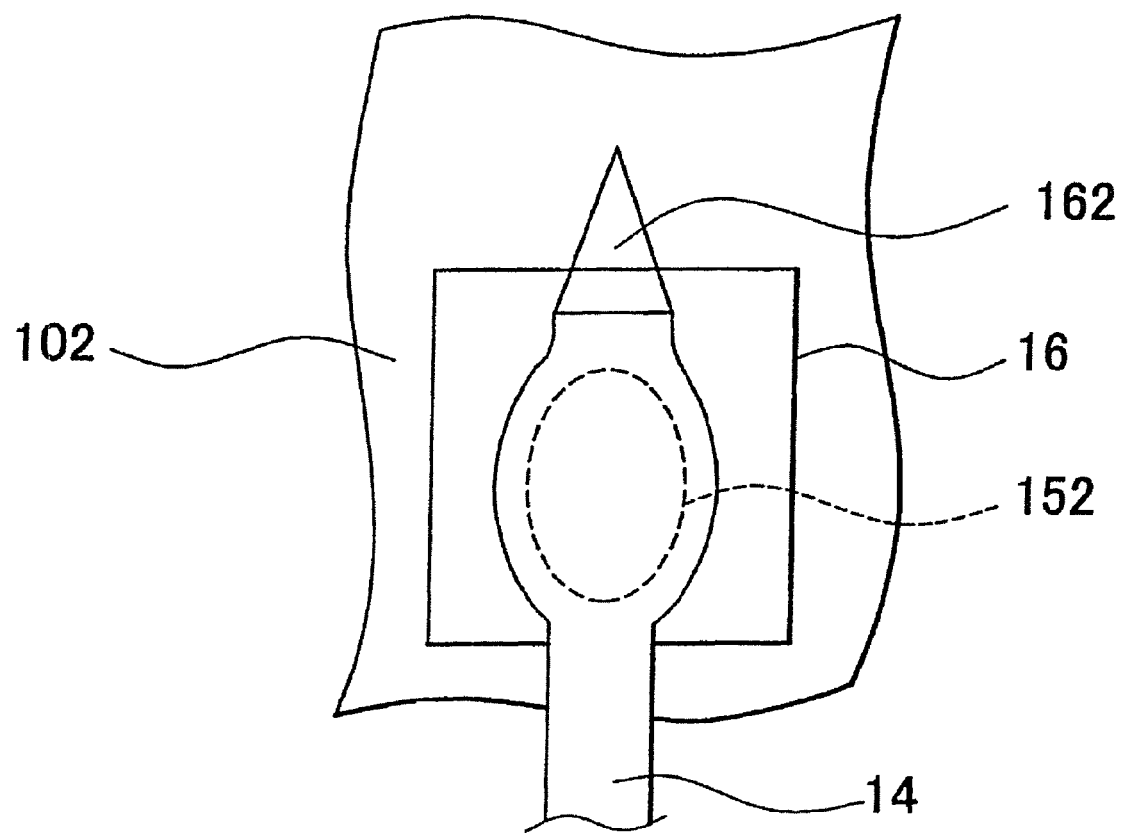
FIG. 17 is a view illustrating problems that may occur in the wire-bonding method used in a related-art semiconductor device.

Referring to FIG. 15, after bonding the wire 14 to the pad 16 as described above, the clamp 138 is moved relative to the wedge tool 134 in the direction indicated by the arrow 154 in FIG. 15 while the wedge tool 134 is kept on the pad 16, whereby the portion of the wire 14 sandwiched between the pad 16 and the wedge tool 134 is torn off. At this time, as shown in FIG. 16, the torn-off portion of the wire 14 creates a dragging trace 162 on the surface of the pad 16. Then, the wedge tool 134 and the clamp 138 are together moved upward in the direction of the arrow 156, and the wire-bonding process is finished. If the protective coating 18 is not provided and each pad 16 is small as shown in the related-art example illustrated in FIG. 17, the dragging trace 162 will be formed beyond the pad 16, thereby damaging and the insulation layer formed on the surface of the semiconductor device 102. If the insulation layer is damaged, impurities may enter the semiconductor device 102 through the damaged portions of the insulation layer, which may reduce the performance of the semiconductor device 102 and may damage the semiconductor device 102. As such, if the protective coatings are not provided at the semiconductor device 102 as in the related-art semiconductor devices, each pad 16 must be made large enough to ensure that the dragging trace 162 is formed within the pad 16 when the wire 14 is cut in the wire-bonding process described above.

The dragging trace 162 is formed in the surface of each pad 16 of the semiconductor device 102 is not limited to when the wire 14 is torn off in the wire-bonding process. For example, if the wedge tool 134 incorporates a wire cutter for cutting the wire 14, the dragging trace 162 may be formed after the wire 14 is cut by said cutter. In this case, too, in order to prevent damage of each insulation layer of the semiconductor device 102, it is necessary to make each pad 16 large enough to ensure that the dragging trace 162 is formed within the pad 16.

According to the semiconductor device 2 of the first example embodiment of the invention, as shown in FIG. 2, the area of each pad 16 is made substantially the same size as the bonding region 30 in which a bonding trace is formed on the surface of the semiconductor device 102 as described above, and the protective coating 18 is formed on the surface of the portion of the insulation layer 24 of the semiconductor device 2 that is located in the direction in which the extension portion 14*e* of the wire 14 is pulled (i.e., the direction indicated by the arrow 32 in FIG. 2). The protective coating 18 is formed in such a shape that its height decreases toward the pad 16. Due to the protective coating 18 thus formed on the insulation layer 24, the extension portion 14*e* of the wire 14 contacts the protective coating 18, not the insulation layer 24, during the wire-bonding process.

According to the semiconductor device 2 of the first example embodiment of the invention, further, each protective coating 18 is formed to have the following three features: (1) The level of the surface of the protective coating 18 is lower than the area through which the extension portion 14*e* of the wire 14 connected to the pad 16 passes when the extension portion 14*e* is cut; (2) The level of the surface of the protective coating 18 is higher than the path that a cut end 14*f* of the conductive wire 14 would take when the extension portion 14*e* of the conductive wire 14 is cut off in the absence of the protective coating 18; and (3) The surface of the protective coating 18 is located closer to the pad 16 than a position at which the path that the cut end 14*f* of the wire 14 would take when the extension portion 14*e* of the conductive wire 14 is cut off in the absence of the protective coating 18, parts from the surface of the semiconductor device 2.

Referring to FIG. 2, the surface of the protective coating 18 is located below the region through which the extension portion 14*e* of the wire 14 passes as the extension portion 14*e* is set in the position where the extension portion 14*de* is cut off. This arrangement prevents interferences between the extension portion 14*e* and the protective coating 18 when cutting the extension portion 14*e* of the wire 14 connected to the pad 16, and therefore the extension portion 14*e* of the wire 14 can be properly pulled from the pad 16 and thus can be properly cut off from the pad 16.

Figure 3:
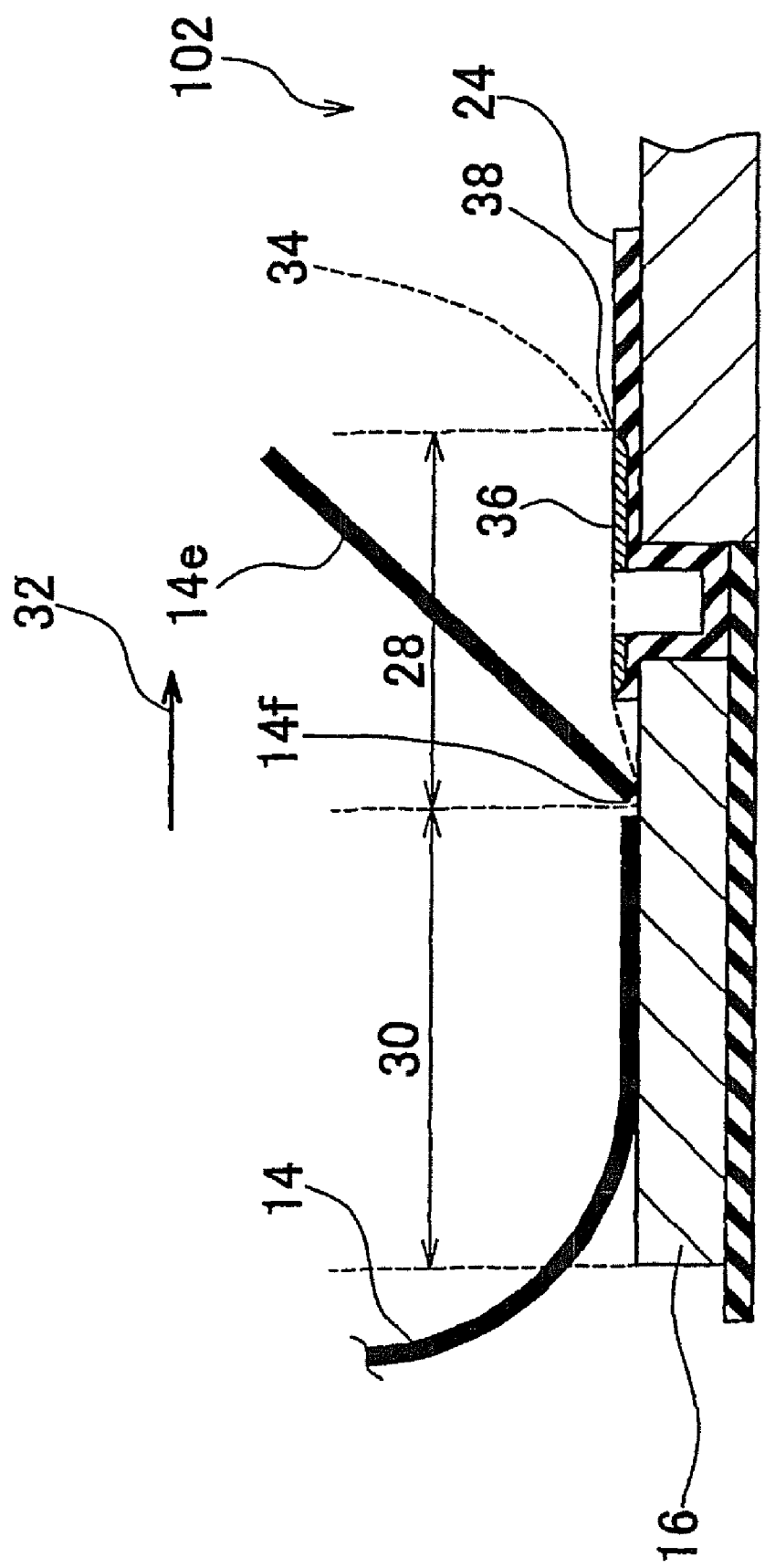
FIG. 3 is a cross-sectional view of a semiconductor device 102.

FIG. 3 illustrates a path 34 that the cut end 14*f* of the wire 14 takes when the extension portion 14*e* is cut off in a state where the protective coating 18 is not provided, and FIG. 3 also illustrates the region of the insulation layer 24 where a dragging trace 36 is formed after the extension portion 14*e* of the wire 14 is cut off. Because the internal structures of the semiconductor devices shown in FIG. 3 onwards are identical to the internal structure of the semiconductor device 2 shown in FIG. 2, they will not described again. If the protective coating 18 is not present, the cut end 14*f* of the extension portion 14*e* moves along the surface of the insulation layer 24 until it reaches an end 38 of a dragging-mark-forming region 28, which is the region where the dragging trace 36 is formed. As the cut end 14*f* of the extension portion 14*e* thus moves, the dragging trace 36 is formed at the surface of the insulation layer 24. Then, as the extension portion 14*e* is pulled upward from the semiconductor device 102, the cut end 14*f* of 14*e* parts from the surface of the insulation layer 24. Therefore, the dragging trace 36 is not formed in the portion of the insulation layer 24 on the side of the end 38 of the dragging-mark-forming region 28 opposite the pad 16. Thus, the dragging trace 36 is formed in the region of the surface of the semiconductor device 102 through which the cut end 14*f* of the extension portion 14*e* moves during the wire-bonding process. According to the semiconductor device 2 of the first example embodiment, as shown in FIG. 2, the protective coating 18 is formed such that the level of the surface of the protective coating 18 is higher than the path 34 of the cut end 14*f* of the extension portion 14*e*. This arrangement increases the distance of the path of the cut end 14*f* of the extension portion 14*e* from the surface of the semiconductor device 2 in comparison to when the protective coating 18 is not present. The protective coating 18 is formed so as to cover a point 38 at which the path 34 of the cut end 14*f* of the extension portion 14*e* parts from the surface of the semiconductor device 102. That is, due to the protective coating 18 thus formed, the cut end 14*f* of the wire 14 is separated from the surface of the semiconductor device 2 when it is on the protective coating 18. Further, by providing the protective coating 18, the region of the surface of the semiconductor device 2 over which the cut end 14*f* of the extension portion 14*e* travels is narrower than it is when the cut end 14*f* of the wire 14 travels along the path 34. Thus, damage to the insulation layer 24 on the surface of the semiconductor device 2 by the cut end 14*f* of the wire 14 may be thereby reliably prevented.

Figure 4:
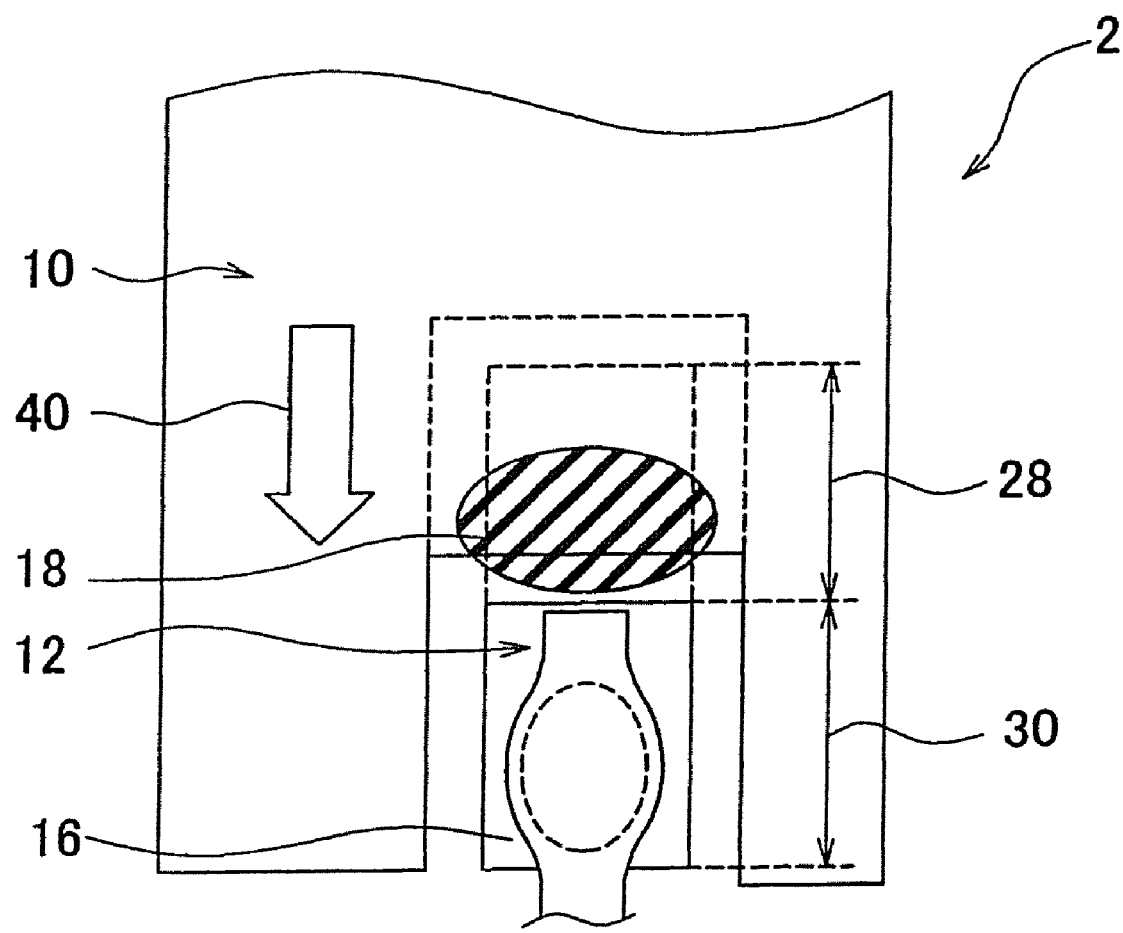
FIG. 4 is an enlarged view of a pad 16 of the semiconductor device 2 and its periphery.

According to the semiconductor device 2 of the first example embodiment of the invention, because the protective coatings 18 each having the above-described features are formed on the surface of the semiconductor device 2, damage to each insulation layer 24 formed on the surface of the semiconductor device 2 is reliably prevented. As such, it is not necessary to form each pad 16 such that it extends on both the bonding region 30 and the dragging-mark-forming region 28 as indicated by the dotted lines in FIG. 4. That is, due to the protective coatings 18, each pad 16 may be made substantially as small as the bonding region 30, whereby the area of the pad region 12 for each pad 16 is reduced. With this arrangement, the area of the effective region 10 for accommodating the semiconductor structures for accomplishing the functions of the semiconductor device 2 may be expanded, and this enhances the electrical characteristics of the semiconductor device.

Figure 7:
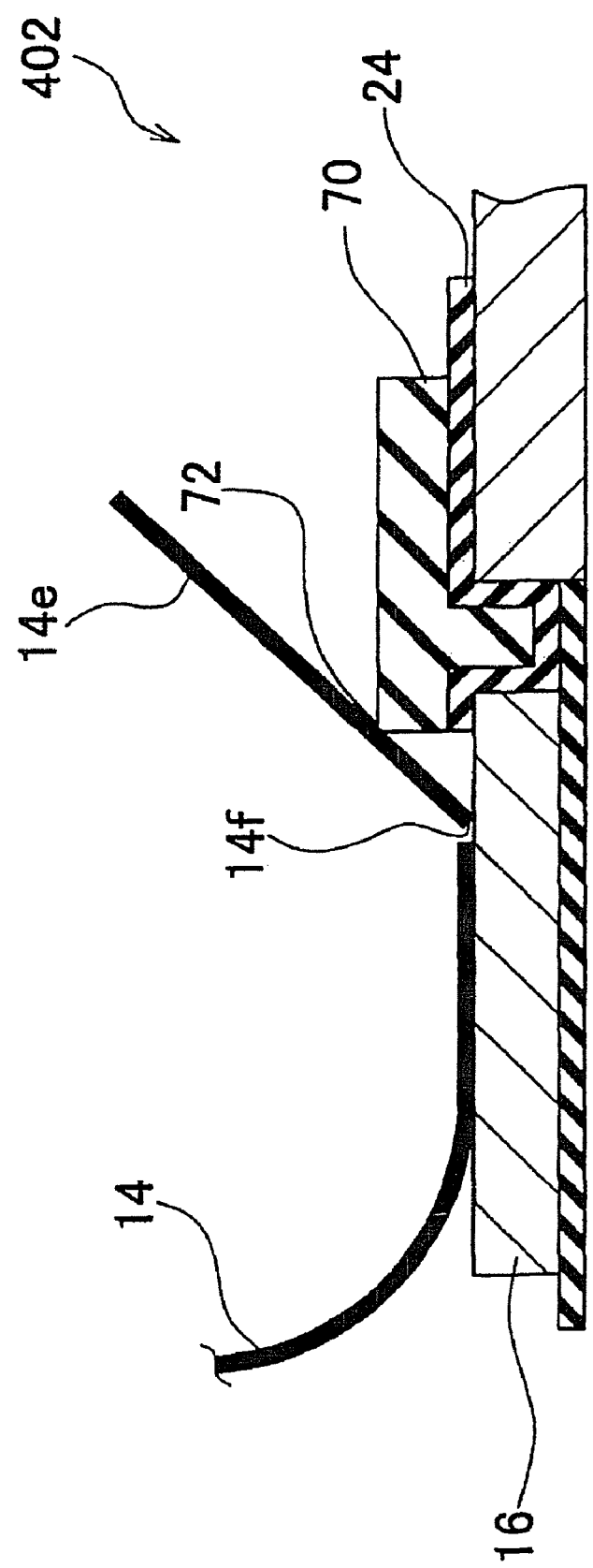
FIG. 7 is a cross-sectional view of a semiconductor device 402.

The pad-side surface of each protective coating 18 is preferably curved as shown in FIG. 2. FIG. 7 schematically shows the structure of a semiconductor device 402 as a comparative example. In the semiconductor device 402, a protective coating 70 having a ridge line 72 that is acutely angled is formed at the pad-side face of the protective coating 70. According to this structure, the extension portion 14*e* contacts the ridge line 72 during the wire-bonding process, and therefore the area of contact between the extension portion 14*e* of the wire 14 and the protective coating 70 is very small. In this case, therefore, the protective coating 70 may easily delaminate or some pieces of the protective coating 70 may be scraped off by the extension portion 14*e* of the wire 14 and then dispersed on the surface of the semiconductor device 402. If the protective coating 70 delaminates, it becomes unable to properly prevent damage of the surface of the semiconductor device 2. Further, if the scraped pieces of the protective coating 70 become attached to the surface of other pad 16 or the surface of the wire 14, it may cause a physical or electrical connection failure. On the other hand, in the semiconductor device 2 of the first example embodiment of the invention, because the pad-side surface of the protective coating 18 is curved as shown in FIG. 2, the area of contact between the protective coating 18 and the wire 14 is increased, and this suppresses damage of the protective coating 18. As such, the structure of the semiconductor device 2 of the first example embodiment enables the wire-bonding process to be implemented in an accurate manner that minimizes the possibility of damage to the insulation layer formed on the surface of the semiconductor device 2 and also minimizes the possibility of physical and electrical connection failures.

Figure 5:
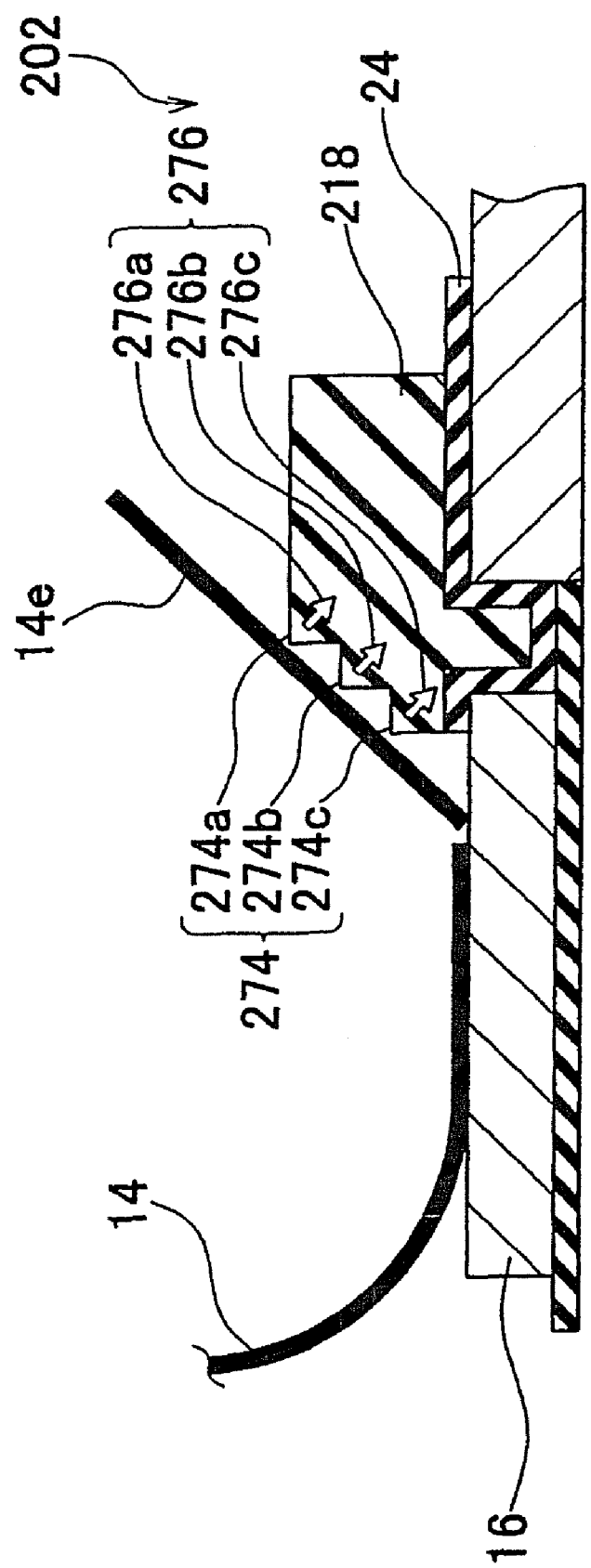
FIG. 5 is a cross-sectional view of a semiconductor device 202 according to the second example embodiment of the invention.

FIG. 5 schematically shows the structure of a semiconductor device 202 according to a second example embodiment of the invention. In the second example embodiment, protective coatings 218 are formed on the semiconductor device 202. Referring to FIG. 5, the pad-side surface of each protective coating 218 is formed in a stepped shape descending toward the pad 16. In this case, the extension portion 14*e* of the wire 14 contacts points 274*a*, 274*b*, and 274*c* of the protective coating 218 during the wire-bonding process. Due to this multi-point contact between the wire 14 and the protective coating 218, the force that acts at each of the points 274*a*, 274*b*, and 274 in the direction indicated by the arrows 276*a*, 276*b*, and 276*c* in FIG. 5 as the extension portion 14*e* of the wire 14 presses the protective coating 218 during the wire-bonding process is small. The structure reduces the frictional force between the extension portion 14*e* of the wire 14 and the protective coating 218, thus minimizing the possibility of delamination of the protective coating 218 and the possibility of some pieces of the protective coating 218 being scraped off by the extension portion 14*e* of the wire 14. As such, the structure of the semiconductor device 202 of the second example embodiment enables the wire-bonding process to be implemented in an accurate manner that minimizes the possibility of damage to the insulation layer formed on the surface of the semiconductor device 202 and also minimizes the possibilities of bonding failures and electrical connection failures between the wire 14 and the pad 16.

Figure 6:
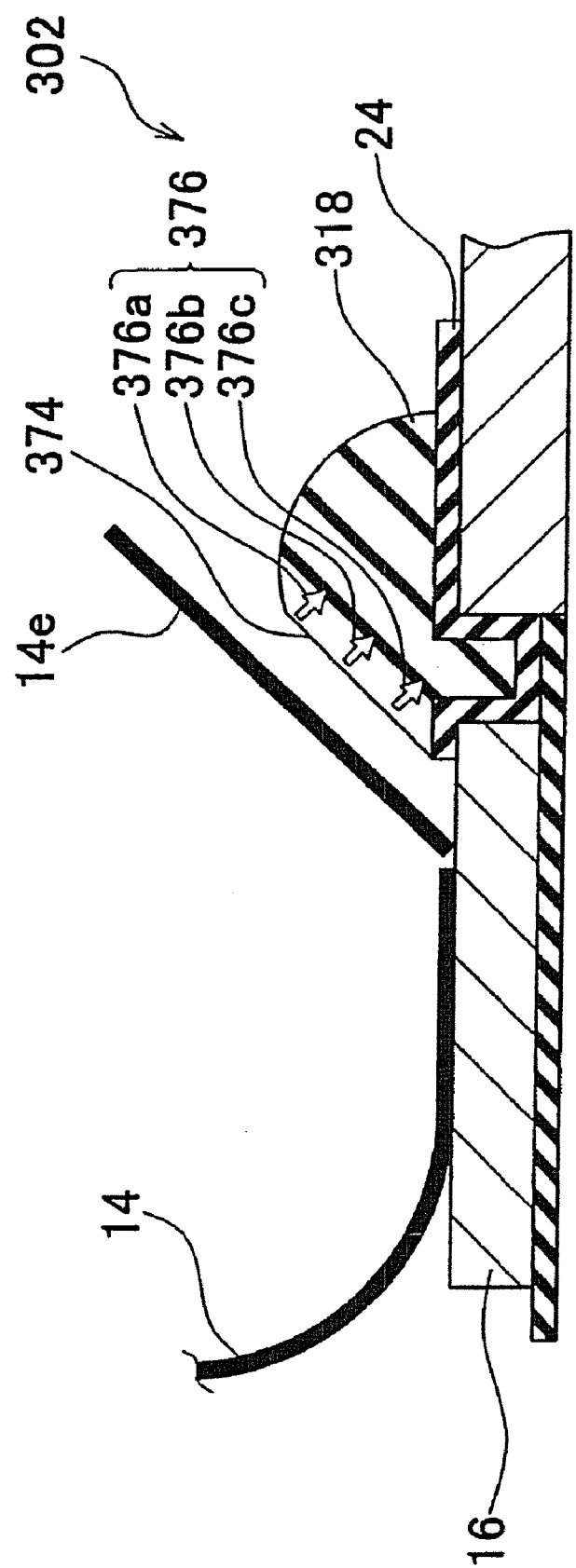
FIG. 6 is a cross-sectional view of a semiconductor device 302 according to the third example embodiment of the invention.

FIG. 6 schematically shows the structure of a semiconductor device 302 according to the third example embodiment of the invention. In this example embodiment, protective coatings 318 are provided on the surface of the semiconductor device 302. Referring to FIG. 6, the pad-side surface of each protective coating 318 includes an inclined surface 374 that is downwardly inclined toward the pad 16. Therefore, when the extension portion 14*e* of the wire 14 contacts the protective coating 318, the area of contact between the extension portion 14*e* of the wire 14 and the protective coating 318 is large. Due to this the large contact-area between the wire 14 and the protective coating 318, the force that acts on the protective coating 318 in the direction indicated by the arrows 376*a*, 376*b*, and 376*c* in FIG. 6 as the extension portion 14*e* of the wire 14 presses the protective coating 318 during the wire-bonding process is small. This structure reduces the frictional force between the extension portion 14*e* of the wire 14 and the protective coating 318, thus minimizing the possibility of delamination of the to protective coating 318 and the possibility of some pieces of the protective coating. 318 being scraped off by the extension portion 14e of the wire 14. As such, the structure of the semiconductor device 302 of the third example embodiment enables the wire-bonding process to be implemented in an accurate manner that minimizes the possibility of damage to the insulation layer formed on the surface of the semiconductor device 302 and also minimizes the possibilities of bonding failures and electrical connection failures between the wire 14 and the pad 16.

Figure 8:
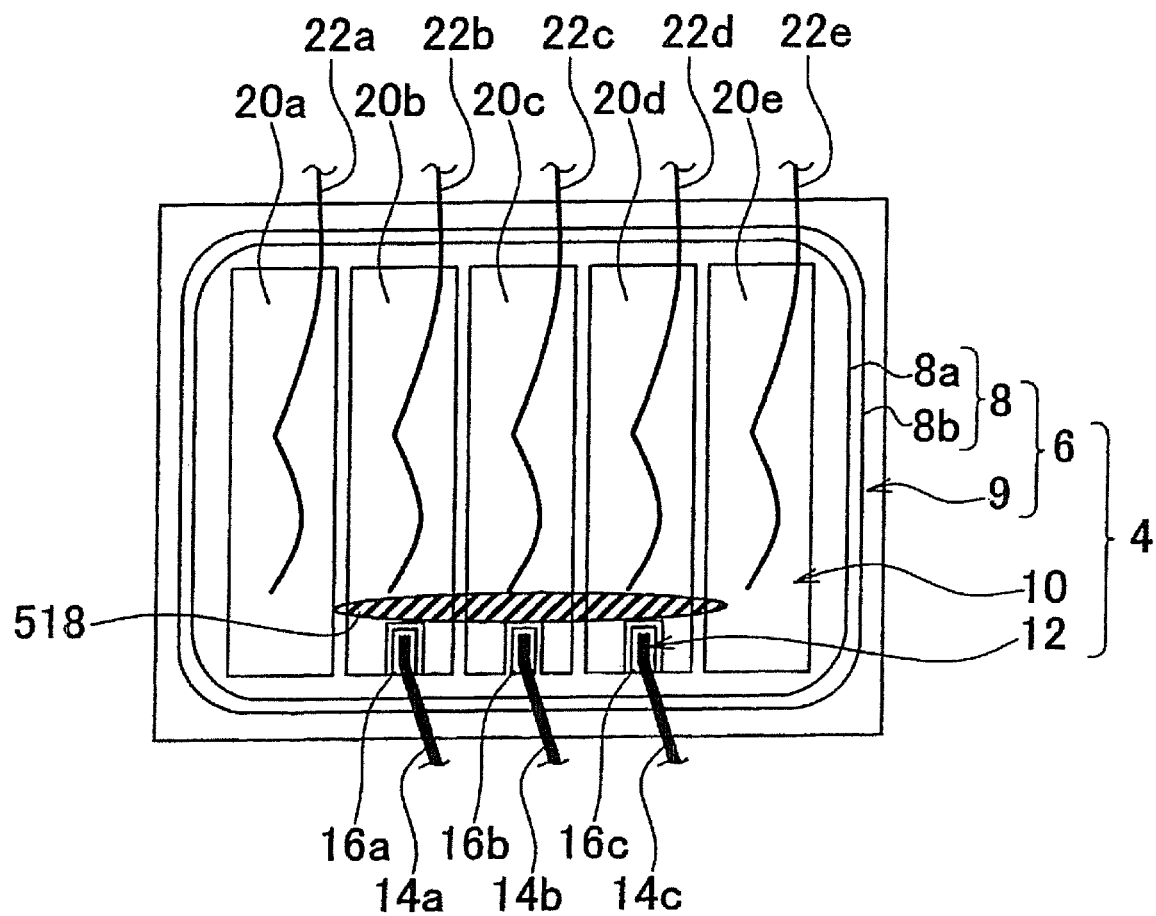
FIG. 8 is a view illustrating an example protective coating formed on a semiconductor device.
Figure 9:
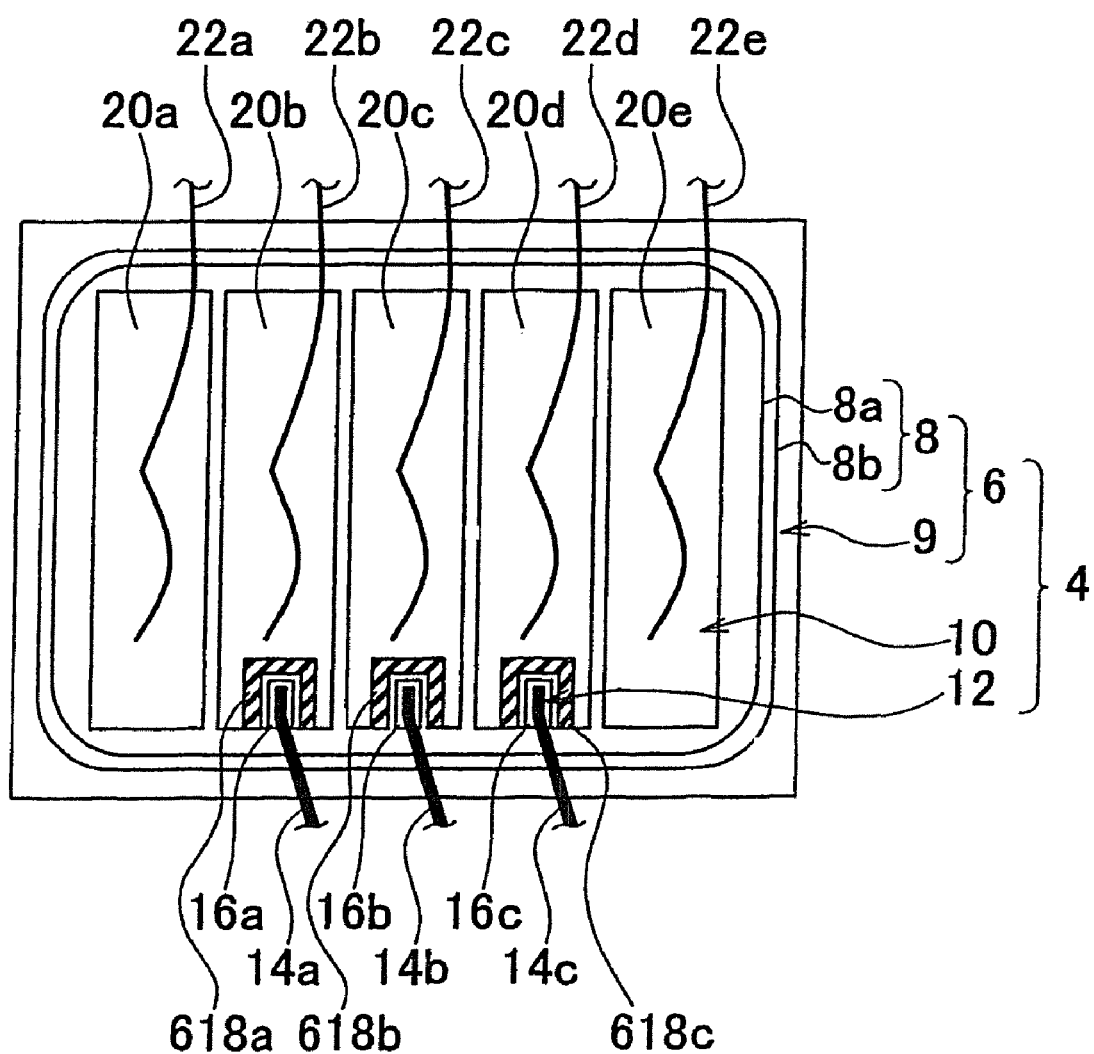
FIG. 9 is a view illustrating example protective coatings formed on a semiconductor device.
Figure 10:
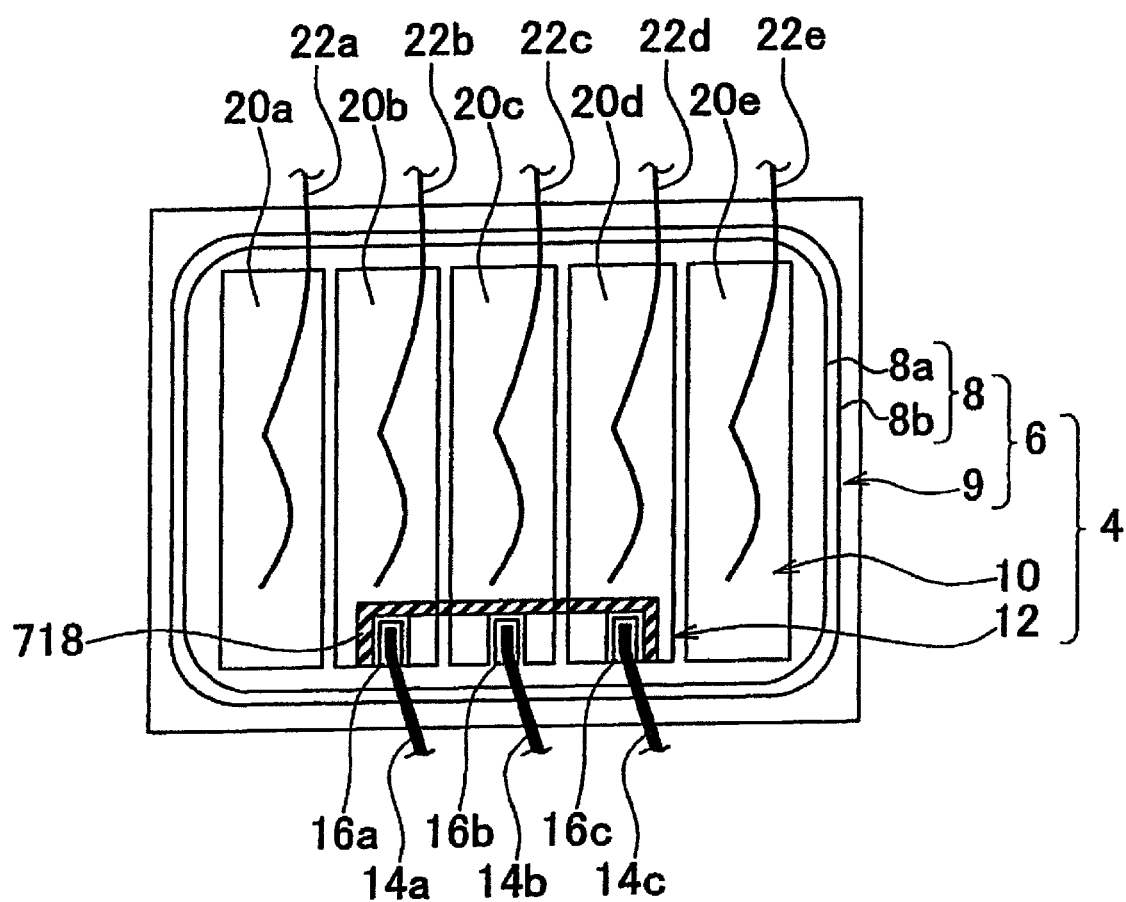
FIG. 10 is a view illustrating an example protective coating formed on a semiconductor device.

While the first to third example embodiments of the invention have been described in detail, it is to be understood that the invention is not limited to the described example embodiments. However, the invention is intended to cover various modifications and equivalent arrangements. For example, with regard to the semiconductor device 2 of the first example embodiment, the position and the entire shape of each protective coating 18 may be changed as long as the protective coating 18 is formed on the side toward which the extension portion 14e of the wire 14 is pulled from the pad 16 during the wire-bonding process as shown in FIG. 2. As such, by providing the protective coating 18 on the side toward which the extension portion 14e of the wire 14 is pulled, the area of each pad region 12 may be reduced, and therefore the area of the effective region 10 for accommodating the semiconductor structures required for the functions of the semiconductor device 2 may be expanded. FIG. 8 to FIG. 10 illustrate other examples of the protective coating formed on the surface of the semiconductor device. In the example illustrated in FIG. 8, a protective coating 518 is formed in place of the protective coatings 18 that are provided at the respective pads 16 as described above. Referring to FIG. 8, the protective coating 518 is formed so as to be adjacent to all the pads 16. In the example illustrated in FIG. 9, protective coatings 618a, 618b, and 618c are provided in place of the protective coatings 18 that are each provided only on the side to which the extension portion 14e of the wire 14 is pulled from the pad 16. Referring to FIG. 9, the protective coatings 618a, 618b, and 618c are formed so as to surround the respective pads 16. In the example illustrated in FIG. 10, a protective coating 718 is formed in place of the protective coatings 18 of the first example embodiment. Referring to FIG. 10, the protective coating 718 is formed so as to surround all the pads 16. In either of the examples illustrated in FIG. 8 to FIG. 10, a protective coating does not need to be provided below the portion of the wire 14 extending toward the pad 16, thereby increasing the freedom of arranging the wire 14 and facilitating downsizing of the pad 16.

As described above, the shape of each protective coating 18 may be changed as needed. Further, each protective coating 18 may be extended, beyond the insulation layer, to such a position that the protective coating 18 partially covers the surface of the pad 16. In this case, it is possible to more effectively reduce the possibility that the cut end 14f of the extension portion 14e of the wire 14 contacts and thereby damages the insulation layer 24.

Figure 11:
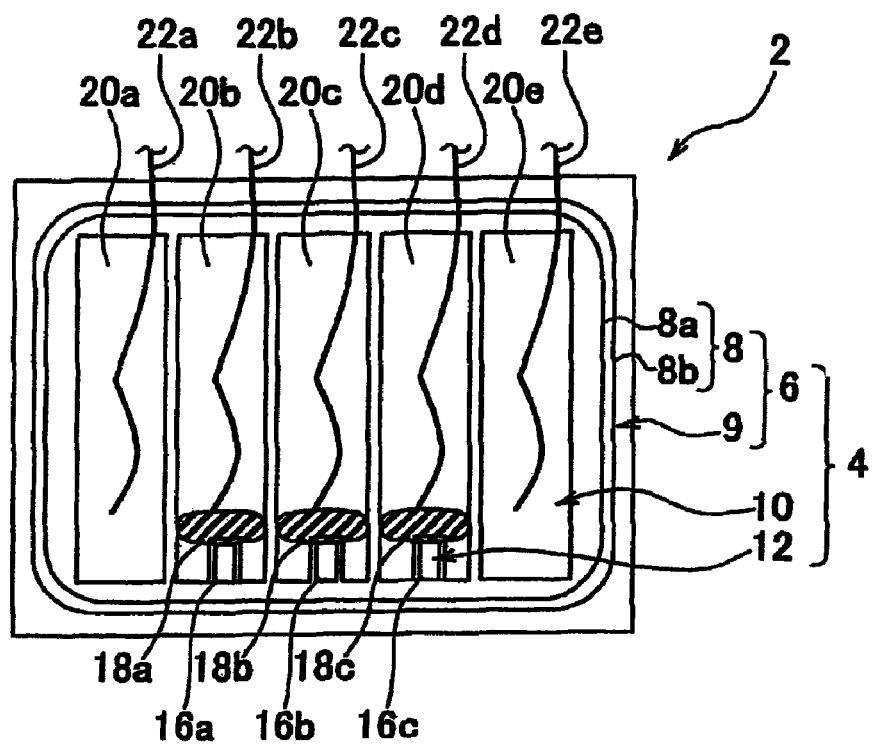
FIG. 11 is a top view of the semiconductor device 2 according to the first example embodiment.

While the protective coatings 18 are used for the wire-bonding process for connecting the wires 14 to the respective pads in the foregoing example embodiments, the protective coatings 18 may alternatively be used for the wire-bonding process to connect wires 22 to the emitter pads 20 as shown in the example illustrated in FIG. 11. Referring to FIG. 11, by using the protective coatings 18 when connecting each wire 22 to the emitter pad 22, it is possible to minimize the possibility that the dragging trace of the wire 20 reaches and thus damages the insulation layer 24 as the extension portion of the wire 20 (not shown in the drawings) is pulled from the emitter pad 20 during the wire-bonding process, which also minimizes the possibility that the dragging trace of the wire 20 reaches the pads 16 as the extension portion of the wire 20 is pulled from the emitter pad 20 during the wire-bonding process. In this case, the emitter pad-side surface of each protective coating is formed to have features identical to the features of the pad-side surface of the protective coating 18.

The protective coatings 18 of the semiconductor device 2 may be made of any coating material as long as it has a high insulation performance, sufficient rigidity to protect the insulation layer, and an adhesiveness. For example, the protective coatings 18 may be made of hardened silicon gel or polyimide tape. If the protective coatings are formed from a coating material having a high Young's modulus, each protective coating deforms as the wire is dragged, and therefore the force applied from the wire to the protective coating may be dispersed. Further, the method for forming each protective coating from such a coating material is not limited to any particular method. For example, a coating material is put on the semiconductor device so that the surface of the coating material is curved, and then the coating material is hardened via a heat treatment, thereby forming a protective coating having a curved surface on the pad. Further, after forming the protective coating, processes that are typically performed when producing semiconductors, such as etching processes, may be performed to the protective coating so as to form the surface of the protective coating into a stepped shape or into a shape having a surface downwardly that is inclined toward the pad.

While the invention has been described with reference to example embodiments thereof, it is to be understood that the invention is not limited to the described embodiments or constructions. On the other hand, the invention is intended to cover various modifications and equivalent arrangements. In addition, while the various elements of the disclosed invention are shown in various example combinations and configurations, other combinations and configurations, including more, less or only a single element, are also within the scope of the appended claims. Further, although multiple objects are accomplished by the technology described in the present specification and illustrated in the accompanying drawings, it is to be noted that said technology is useful even if it accomplishes only one of the objects.

The invention claimed is:

1. A semiconductor device comprising:
   a semiconductor substrate;
   a surface electrode that is formed on a surface of the semiconductor substrate;
   an interlayer insulation layer that is formed on the surface of the semiconductor substrate;
   a pad which is formed on a surface of the interlayer insulation layer, and to which a conductive wire is connected;
   a surface insulation layer that is formed on a surface of the surface electrode; and
   a protective coating, that is formed on a surface of the insulation layer, and that is used to protect the surface insulation layer from a cut end of the conductive wire connected to the pad, wherein
   the protective coating is formed at a position near the pad,
   a height of the protective coating decreases toward the pad and toward the cut end of the conductive wire,
   a surface of the protective coating facing towards the cut end is an inclined surface that is downwardly inclined toward the cut end of the conductive wire, and
   an inclination angle of the surface of the protective coating facing towards the cut end is smaller than an inclination angle of a surface of the protective coating on a side opposite to the cut end.

2. The semiconductor device according to claim 1, wherein the protective coating is provided on a region of the surface of the semiconductor device on a first side toward which the conductive wire is pulled during a wire-bonding process for bonding the conductive wire to the semiconductor device, and a region of the surface of the semiconductor device on a second side that is opposite to the first side is not provided with the protective coating.

3. The semiconductor device according to claim 1, wherein the level of the surface of the protective coating is lower than a region through which an extension portion of the conductive wire connected to the pad passes when the extension portion is set in a position where the extension portion is cut off.

4. The semiconductor device according to claim 1, wherein the level of the surface of the protective coating is higher than a path that a cut end of the conductive wire would take as the extension portion of the conductive wire is cut off in the absence of the protective coating.

5. The semiconductor device according to claim 1, wherein the surface of the protective coating is located closer to the pad than a position at which a path that a cut end of the conductive wire would take as the extension portion of the conductive wire is cut off parts from the surface of the semiconductor device in the absence of the protective coating.

6. The semiconductor device according to claim 1, wherein the level of the surface of the protective coating is lower than a region through which an extension portion of the conductive wire connected to the pad passes as the extension portion is set in a position where the extension portion is cut off;

the level of the surface of the protective coating is higher than a path that a cut end of the conductive wire would take as the extension portion of the conductive wire is cut off in the absence of the protective coating; and the surface of the protective coating is located closer to the pad than a position at which the path parts from the surface of the semiconductor device.

7. The semiconductor device according to claim 1, wherein the protective coating comprises a silicon gel or a polyimide tape.

\* \* \* \* \*